United States Patent [19]
Yanai

[11] Patent Number: 5,723,878
[45] Date of Patent: Mar. 3, 1998

[54] ACTIVE MATRIX LIQUID CRYSTAL PANEL HAVING THIN FILM TRANSISTORS

[75] Inventor: Koichi Yanai, Tokyo, Japan

[73] Assignee: NEC Corporation, Tokyo, Japan

[21] Appl. No.: 702,949

[22] Filed: Aug. 26, 1996

[30] Foreign Application Priority Data

Aug. 24, 1995 [JP] Japan ................................. 7-237836

[51] Int. Cl.⁶ ........................ H01L 29/04; H01L 31/036
[52] U.S. Cl. ............................ 257/59; 257/52; 257/53; 257/83; 257/88; 257/443; 257/431
[58] Field of Search ........................ 257/59, 72, 444, 257/446, 79, 80, 81, 82, 83, 88, 52, 53, 443, 431, 432, 436, 451, 84; 349/55, 92, 93, 44, 45, 110; 363/30, 120, 122

[56] References Cited

U.S. PATENT DOCUMENTS

| | | | |
|---|---|---|---|
| 4,862,234 | 8/1989 | Koden | 257/81 |
| 5,164,851 | 11/1992 | Kanemori et al. | 257/59 |
| 5,426,313 | 6/1995 | Sukegawa et al. | 257/59 |

*Primary Examiner*—Carl W. Whitehead
*Attorney, Agent, or Firm*—Young & Thompson

[57] ABSTRACT

The present invention provides a thin film transistor substrate for a liquid crystal display panel. The thin film transistor substrate comprises the following elements. A pixel electrode is provided on a first predetermined region of the transparent insulative substrate. A first optical shielding film being is made of a metal and is provided on a peripheral region of the pixel electrode. A thin film transistor is provided on a second predetermined region of the transparent insulative substrate. The thin film transistor comprises a gate electrode provided on the transparent insulative substrate, a gate insulation film provided to extend over the second predetermined region to cover the gate electrode and also extend on at least an outer portion of the first optical shielding film, a source electrode extending at least over the gate insulation film over a first half of the gate electrode and being electrically connected to the pixel electrode, and a drain electrode extending at least over the gate insulation film over a second half of the gate electrode. A signal line extends over the gate insulation film to the drain electrode so that the signal line is positioned above the pixel electrode and separated by the gate oxide film from the pixel electrode. A second optical shielding film extends over the thin film transistor provided on the second region and also extends over an outer part of the first optical shielding film so that an opening portion of the pixel electrode is substantially defined by an inside edge of the first optical shielding film.

20 Claims, 2 Drawing Sheets

ACTIVE MATRIX LIQUID CRYSTAL PANEL HAVING THIN FILM TRANSISTORS

BACKGROUND OF THE INVENTION

The present invention relates to an active matrix liquid crystal panel having thin film transistors.

In the active matrix liquid crystal panel, shielding films are provided on either a thin film transistor substrate having thin film transistors or an opposite substrate to the thin film transistor substrate, or on both thereof.

FIG. 1 is a fragmentary cross sectional elevation view illustrative of a conventional active matrix liquid crystal display panel with a thin film transistor, which is also disclosed in the Japanese laid-open patent publication No. 2-166422.

Thin film transistors and pixel electrodes are provided on a glass substrate 21. A gate electrode 22 of the thin film transistor is selectively formed on a predetermined area of the glass substrate 21. A gate insulation film 23 is formed to extend over the gate electrode 22 and over the top surface of the glass substrate 21. An undoped amorphous silicon layer 24 is selectively formed on the gate insulation film 23 to extend only over the gate electrode 22. A highly doped amorphous silicon layer 25 is formed on the undoped amorphous silicon layer 24 except for a center area of the undoped amorphous silicon layer 24. The highly doped amorphous silicon layer 25 is doped with phosphorus at a high impurity concentration so that the amorphous silicon takes a degenerate state. Pixel electrodes 26 made of indium tin oxide are selectively formed on the gate insulation film 23 so that the pixel electrodes 26 are spaced apart from the undoped amorphous silicon layer 24 being also formed on the gate insulation film 23. A drain electrode 27 is formed on a left half of the highly doped amorphous silicon layer 25. The drain electrode 27 is electrically connected to a signal line which runs over the glass substrate 21 and is not illustrated in FIG. 1. A source electrode 28 is formed to extend over a right half of the highly doped amorphous silicon layer 25 and within an aperture between the undoped amorphous silicon layer 24 and the pixel electrodes 26 as wall as over an end portion of the pixel electrodes 26 so that the source electrode 28 is in contact with the pixel electrode 26 whereby the source electrode 28 is electrically connected to the pixel electrode 26. The drain and source electrodes 27 and 28 are in contact with the highly doped amorphous silicon layer 25 in the degenerate state so as to ohmic contacts between the drain/source electrodes 27 and 28 and the highly doped amorphous silicon layer 25. The drain and source electrodes 27 and 28 do not extend over the center area of the undoped amorphous silicon layer 24 and are spaced apart from each other. A passivation insulation film 29 is formed to extend over an entire of the substrate. Namely, the passivation insulation film 29 extends over the pixel electrode 26, within an aperture between the pixel electrode 26 and the undoped amorphous silicon layer 24, on an outer side wall of the drain electrode 27, over the top surface of the drain electrode 27, and on an inner side wall of the drain electrode 27. The passivation insulation film 29 further extends over an exposed surface of the undoped amorphous silicon layer 24, on an inner side wall of the source electrode 28, over the top surface of the source electrode, on an outer side wall of the source electrode 28 and over the pixel electrode 26. An organic optical shielding film 30 is selectively formed on the passivation insulation film 29 so as to extend over the thin film transistor and do not extend over the pixel electrode 26. The organic optical shielding film 30 comprises a negative photo-resist film including a black pigment whereby a thin film transistor substrate is formed.

The above thin film transistor substrate is bonded via spacers to an opposite substrate so as to form a small gap between the thin film transistor substrate and the opposite substrate. A liquid crystal is injected into the small gap between the thin film transistor substrate and the opposite substrate to thereby form a liquid crystal display panel.

As described above, the pixel electrode 26 and the signal line not illustrated are formed in the same layer, namely at the same level, for which reason in order to prevent the pixel electrode 26 from contacting with the signal line, it is required to form the pixel electrodes 26 on the limited areas which are separated from the signal lines. This results in a limitation in the area of the pixel electrode 26. The optical shielding film 30 defining an opening portion is formed on the area except for the pixel electrode 26, for which reason the limitation in area of the pixel electrode 26 results in a limitation in area of the opening portion. This limits a rate of opening area of the optical shielding film 30.

Assuming that in order to increase the rate of opening area of the optical shielding film 30, the area of the optical shielding film 30 is reduced whilst the area of the pixel electrode 26 remains unchanged, then in plane view a gap is formed between the pixel electrode 26 and the optical shielding film 30. A liquid crystal positioned over the pixel electrode 26 is controllable by applying an electric field to the liquid crystal whilst the liquid crystal positioned over the optical shielding film 30 and over the gap between the optical shielding film 30 and the pixel electrode 26 is uncontrollable. A light having passed through the uncontrolled liquid crystal is partially shielded by the optical shielding film 30. Namely a light having passed through the uncontrolled liquid crystal positioned over the gap between the optical shielding film 30 and the pixel electrode 26 is not shielded by the optical shielding film 30 whereby a leakage of light appears. For this reason, in order to prevent any leakage of light, it is required to provide the organic optical shielding film which overlaps a peripheral portion of the pixel electrode 26 unless another optical shielding film is provided on the opposite substrate for shielding the leakage of light from the thin film transistor substrate.

It is, therefore, required to have the organic optical shielding film 30 overlap the peripheral portion of the pixel electrode 26 for the purpose of shielding of the leakage of light. This requires an extremely high accuracy in definition of the organic optical shielding film which defines the opening area. This further requires an extremely high accuracy of patterning of the organic optical shielding film. Actually, however, a possible accuracy of patterning of the organic optical shielding film is limited only at a few micrometers which are insufficient for obtaining the required high accuracy in definition of the organic optical shielding film. It is rather the fact that the organic optical shielding film has a somewhat rough definition. This may result in a variation in opening area of the organic optical shielding film.

In addition, a long time development subjected to the organic optical shielding film makes the definition of the edges of the organic optical shielding film rough. Differently from the metal optical shielding film, a sufficient large thickness of the organic optical shielding film is required to ensure a sufficient and required shielding capability. Such large thickness of the organic optical shielding film forms a large step at its end portion. If the organic optical shielding film has end portions roughly defined or forms a large step at its end portions, then it may be difficult to control orientations of liquid crystal in the vicinity of the organic optical shielding film and over the end of the pixel electrode 26 whereby any bright point may appears that position even in the black mode of the display. This results in a reduction in contrast of the display.

It had been therefore required to enlarge the rate of opening area of the optical shielding film without any variation thereof and further to provide a liquid crystal panel with a high contrast.

SUMMARY OF THE INVENTION

Accordingly, it is an object of the present invention to provide a liquid crystal panel free from any problems and disadvantages as described above.

It is an object of the present invention to provide a liquid crystal panel having an increased and constant rate of opening area of an optical shielding film provided therein.

It is a furthermore object of the present invention to provide a liquid crystal panel having a high contrast ratio.

The above and other objects, features and advantages of the present invention will be apparent from the following descriptions.

The present invention provides a thin film transistor substrate for a liquid crystal display panel. The thin film transistor substrate comprises the following elements. A pixel electrode is provided on a first predetermined region of the transparent insulative substrate. A first optical shielding film being is made of a metal and is provided on a peripheral region of the pixel electrode. A thin film transistor is provided on a second predetermined region of the transparent insulative substrate. The thin film transistor comprises a gate electrode provided on the transparent insulative substrate, a gate insulation film provided to extend over the second predetermined region to cover the gate electrode and also extend on at least an outer portion of the first optical shielding film, a source electrode extending at least over the gate insulation film over a first half of the gate electrode and being electrically connected to the pixel electrode, and a drain electrode extending at least over the gate insulation film over a second half of the gate electrode. A signal line extends over the gate insulation film to the drain electrode so that the signal line is positioned above the pixel electrode and separated by the gate oxide film from the pixel electrode. A second optical shielding film extends over the thin film transistor provided on the second region and also extends over an outer part of the first optical shielding film so that an opening portion of the pixel electrode is substantially defined by an inside edge of the first optical shielding film.

The present invention provides a thin film transistor substrate for a liquid crystal display panel. The thin film transistor substrate comprises the following elements. A plurality of scanning lines extend over a transparent insulative substrate in a first direction. A plurality of signal lines extends over the transparent insulative substrate in a second direction vertical to the first direction so that signal lines in cooperation with the scanning lines form arrays of pixel regions surrounded by the scanning lines and the signal lines.

Each of the pixel regions has the following elements. A pixel electrode is provided on a first predetermined region of the transparent insulative substrate. A first optical shielding film is made of a metal and is provided on a peripheral region of the pixel electrode. A thin film transistor is provided on a second predetermined region of the transparent insulative substrate. The thin film transistor comprises a gate electrode provided on the transparent insulative substrate, a gate insulation film provided to extend over the second predetermined region to cover the gate electrode and also extend on at least an outer portion of the first optical shielding film, a source electrode extending at least over the gate insulation film over a first half of the gate electrode and being electrically connected to the pixel electrode, and a drain electrode extending at least over the gate insulation film over a second half of the gate electrode. The signal line extends over the gate insulation film to the drain electrode so that the signal line is positioned above the pixel electrode and separated by the gate oxide film from the pixel electrode. A second optical shielding film extends over the thin film transistor provided on the second region and also extending over an outer part of the first optical shielding film so that an opening portion of the pixel electrode is substantially defined by an inside edge of the first optical shielding film.

BRIEF DESCRIPTIONS OF THE DRAWINGS

Preferred embodiments according to the present invention will be described in detail with reference to the accompanying drawings.

DISCLOSURE OF THE INVENTION

Figure 1:
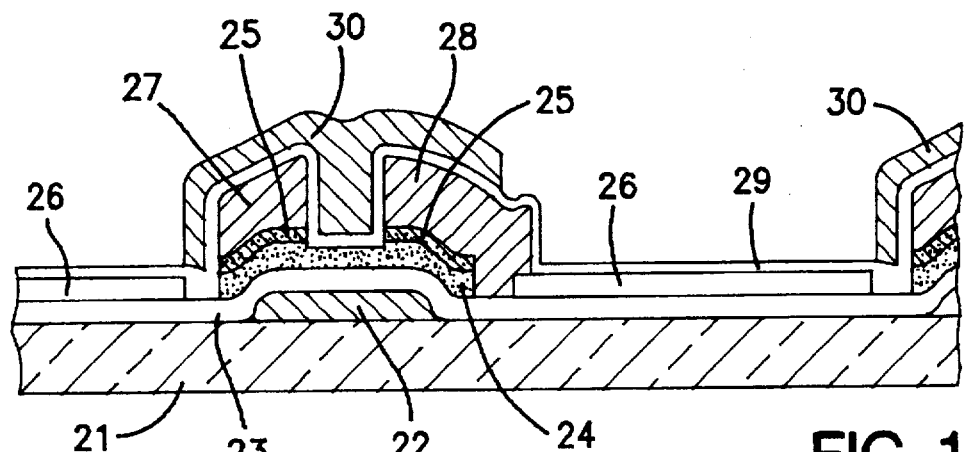
FIG. 1 is a fragmentary cross sectional elevation view illustrative of the conventional liquid crystal panel having thin film transistors and pixel electrodes.

The present invention provides a thin film transistor substrate for a liquid crystal display panel. The thin film transistor substrate comprises the following elements. A pixel electrode is provided on a first predetermined region of the transparent insulative substrate. A first optical shielding film being is made of a metal and is provided on a peripheral region of the pixel electrode. A thin film transistor is provided on a second predetermined region of the transparent insulative substrate. The thin film transistor comprises a gate electrode provided on the transparent insulative substrate, a gate insulation film provided to extend over the second predetermined region to cover the gate electrode and also extend on at least an outer portion of the first optical shielding film, a source electrode extending at least over the gate insulation film over a first half of the gate electrode and being electrically connected to the pixel electrode, and a drain electrode extending at least over the gate insulation film over a second half of the gate electrode. A signal line extends over the gate insulation film to the drain electrode so that the signal line is positioned above the pixel electrode and separated by the gate oxide film from the pixel electrode. A second optical shielding film extends over the thin film transistor provided on the second region and also extends over an outer part of the first optical shielding film so that an opening portion of the pixel electrode is substantially defined by an inside edge of the first optical shielding film.

It is preferable that the transparent insulative substrate is a glass substrate.

It is also preferable that the second optical shielding film is made of a resistive organic material.

It is also preferable to further provide an inter-layer insulator extending under the second optical shielding film and over the source and drain electrodes to isolate the second optical shielding film from the source and drain electrodes. In this case, the second optical shielding film may be made of a conductive organic material.

It is also preferable that the source electrode further extends over the inner portion of the first optical shielding film and over a part of the pixel electrode in the vicinity of the first optical shielding film.

It is also preferable that the source electrode further extends over the inner portion of the first optical shielding film.

It is also preferable that the first optical shielding film is made of chromium.

It is also preferable that the second optical shielding film is made of a photo-sensitive organic material.

It is also preferable that the second optical shielding film is made of a non photo-sensitive organic material.

The pixel electrode and the signal line are formed at the different levels and isolated from each other by the gate insulation film. For those reasons, it is possible to have the pixel electrode extends toward the signal line without contacting the pixel electrode with the signal line. This results in increase in area of the pixel electrode. This further allows increase in area of the each opening portion. This results in an increased rate of the opening portions of the optical shielding film.

The opening portion of the pixel electrode is defined by the inner edges of the metal optical shielding film which extends inside rather than the organic optical shielding film. A deterioration of the orientation of the liquid crystal positioned in the vicinity of the edge portions of the organic optical shielding film may be compensated by the metal optical shielding film because the metal optical shielding film covers the edges of the organic optical shielding film so that a light having transmitted through the liquid crystal positioned in the vicinity of the edge of the organic optical shielding film. This means that the metal optical shielding film suppresses any reduction in contrast of the display panel.

As described above, since the opening portion of the pixel electrode is defined by the metal optical shielding film having no variation of the opening pattern, the rate of opening area of the pixel electrode is constant even the organic optical shielding film has variations in opening patterns thereof. The constant rate of opening area of the pixel electrode ensures a high quality and uniform high fine picture.

The present invention provides a thin film transistor substrate for a liquid crystal display panel. The thin film transistor substrate comprises the following elements. A plurality of scanning lines extend over a transparent insulative substrate in a first direction. A plurality of signal lines extends over the transparent insulative substrate in a second direction vertical to the first direction so that signal lines in cooperation with the scanning lines form arrays of pixel regions surrounded by the scanning lines and the signal lines.

Each of the pixel regions has the following elements. A pixel electrode is provided on a first predetermined region of the transparent insulative substrate. A first optical shielding film is made of a metal and is provided on a peripheral region of the pixel electrode. A thin film transistor is provided on a second predetermined region of the transparent insulative substrate. The thin film transistor comprises a gate electrode provided on the transparent insulative substrate, a gate insulation film provided to extend over the second predetermined region to cover the gate electrode and also extend on at least an outer portion of the first optical shielding film, a source electrode extending at least over the gate insulation film over a first half of the gate electrode and being electrically connected to the pixel electrode, and a drain electrode extending at least over the gate insulation film over a second half of the gate electrode. The signal line extends over the gate insulation film to the drain electrode so that the signal line is positioned above the pixel electrode and separated by the gate oxide film from the pixel electrode. A second optical shielding film extends over the thin film transistor provided on the second region and also extending over an outer part of the first optical shielding film so that an opening portion of the pixel electrode is substantially defined by an inside edge of the first optical shielding film.

It is preferable that the transparent insulative substrate is a glass substrate.

It is also preferable that the second optical shielding film is made of a resistive organic material.

It is preferable to further provide an inter-layer insulator extending under the second optical shielding film and over the source and drain electrodes to isolate the second optical shielding film from the source and drain electrodes. In this case, the second optical shielding film may be made of a conductive organic material.

It is also preferable that the source electrode further extends over the inner portion of the first optical shielding film and over a part of the pixel electrode in the vicinity of the first optical shielding film.

It is also preferable that the source electrode further extends over the inner portion of the first optical shielding film.

It is also preferable that the first optical shielding film is made of chromium.

It is also preferable that the second optical shielding film is made of a photo-sensitive organic material.

It is also preferable that the second optical shielding film is made of a non photo-sensitive organic material.

The pixel electrode and the signal line are formed at the different levels and isolated from each other by the gate insulation film. For those reasons, it is possible to have the pixel electrode extends toward the signal line without contacting the pixel electrode with the signal line. This results in increase in area of the pixel electrode. This further allows increase in area of the each opening portion. This results in an increased rate of the opening portions of the optical shielding film.

The opening portion of the pixel electrode is defined by the inner edges of the metal optical shielding film which extends inside rather than the organic optical shielding film.

A deterioration of the orientation of the liquid crystal positioned in the vicinity of the edge portions of the organic optical shielding film may be compensated by the metal optical shielding film because the metal optical shielding film covers the edges of the organic optical shielding film so that a light having transmitted through the liquid crystal positioned in the vicinity of the edge of the organic optical shielding film. This means that the metal optical shielding film suppresses any reduction in contrast of the display panel.

As described above, since the opening portion of the pixel electrode is defined by the metal optical shielding film having no variation of the opening pattern, the rate of opening area of the pixel electrode is constant even the organic optical shielding film has variations in opening patterns thereof. The constant rate of opening area of the pixel electrode ensures a high quality and uniform high fine picture.

PREFERRED EMBODIMENTS

A first embodiment according to the present invention will be described in detail with reference to FIG. 2 which is illustrative of a novel liquid crystal panel having signal lines and scanning lines running in vertical to the signal lines to form matrixes within which pixel electrodes are formed.

Over a thin film transistor substrate, scanning lines 12 are provided to extend in parallel to each other and further signal lines 13 are provided to extend in parallel to each other but in vertical to the scanning lines 12 so as to matrixes, within each of which a pixel electrode 2 is provided. A thin film transistor is provided at one corner of each of the matrixes surrounded by the scanning lines 12 and the signal lines 13. The thin film transistor has a gate electrode 3 which is connected to the scanning line 12, a source electrode 8 which is connected to the pixel electrode 2 and a drain electrode 7 which is connected to the signal line 13 so that the pixel electrode 2 is electrically connected via the thin film transistor provided at the corner of the each matrix to the signal line 13 extends on a boundary between the matrixes. Metal optical shielding films 11 of a loop like shape is provided on a peripheral portion of each of the pixel electrode 2. An organic optical shielding film 9 is provided over the thin film transistors, the scanning lines 12 and the signal lines 13 as well as over an outer half part of each of the metal optical shielding film 11, wherein the organic optical shielding film 9 has arrays of opening portions, each of which has edges positioned over a looped center line of the looped metal optical shielding film 11 so that each of the opening portions of the organic optical shielding film 9 extends over an inner half portion of the looped metal optical shielding film 11 and an exposed surface of the pixel electrode 2.

Figure 3:
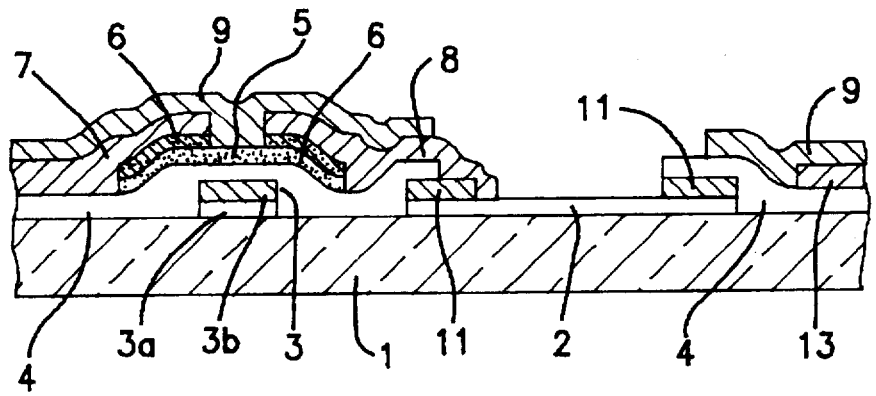
FIG. 3 is a fragmentary cross sectional elevation view illustrative of a novel liquid crystal panel having thin film transistors and pixel electrodes provided on a thin film transistor substrate, taken along A–A' line in FIG. 2 in a first embodiment in accordance with the present invention.
Figure 2:
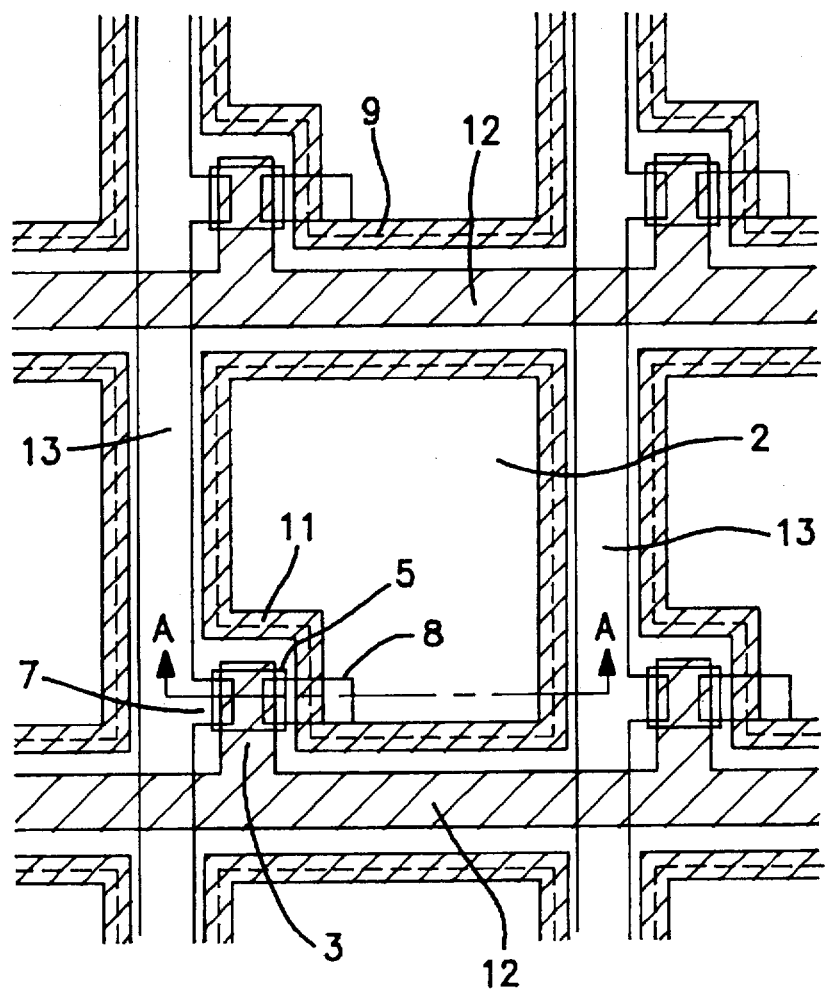
FIG. 2 is a fragmentary plane view illustrative of a novel liquid crystal panel having signal lines and scanning lines running in vertical to the signal lines to form matrixes within which pixel electrodes are formed in accordance with the present invention.

FIG. 3 is a fragmentary cross sectional elevation view illustrative of a novel liquid crystal panel having thin film transistors and pixel electrodes provided on a thin film transistor substrate, taken along A-A' line in FIG. 2 in a first embodiment in accordance with the present invention.

On a single glass substrate 1, the thin film transistors and the pixel electrodes 2 are provided. Each of the pixel electrodes 2 is selectively provided on a predetermined area of the glass substrate 1, wherein the predetermined area is separated from an area on which each thin film transistor is formed. The metal optical shielding film 11 is provided on the peripheral region of the pixel electrode 2. A transparent conductive film 3a is selectively provided on the glass substrate 1, wherein the transparent conductive film 3a is spaced apart from the pixel electrodes 2. A metal film 3b is provided on the transparent conductive film 3a so that laminations of the transparent conductive film 3a and the metal film 3b forms the gate electrode 3. A gate insulation film 4 is provided which extends over the glass substrate 1 and the gate electrode 3 as well as over the outer half region of the metal optical shielding film 11 positioned adjacent to the thin film transistor but over the entire region of the metal optical shielding film 11 positioned adjacent to the signal line 13. The gate insulation film 4 does not extend over the inner half region of the metal optical shielding film 11 positioned adjacent to the thin film transistor and over the pixel electrode uncovered. The gate insulation film 4 has a hillock over the gate electrode and another hillock over the metal optical shielding film 11. An undoped amorphous silicon layer 5 is selectively provided on the gate insulation film 3 over the gate electrode 3 and its adjacent portion so that the undoped amorphous silicon layer 5 extends over the hillock and gradually sloped portions around the hillock. Highly doped amorphous silicon films 6 are separately formed on the undoped amorphous silicon layer 5 so that the highly doped amorphous silicon films 6 extend over the end portion of the top of the hillock as well as the gradually sloped portions of the hillock. The highly doped amorphous silicon films 6 are doped with phosphorus at a high impurity concentration so that amorphous silicon is in the degenerate state. The drain electrode is provided to extend over the highly doped amorphous silicon film 6 positioned at the left half side of the hillock and over the flat portion of the gate insulation film 4. The source electrode 8 is provided to extend over the highly doped amorphous silicon film 6 positioned at the right half side of the hillock and over the flat portion of the gate insulation film 4 and further continuously extends over the gate insulation film and the inner half portion of the metal optical shielding film 11 in addition extends on the pixel electrode 2 in the vicinity of the metal optical shielding film 11 so that the source electrode 8 is made into contact directly with the pixel electrode 2. The drain and source electrodes 7 and 8 do not extend over the center area of the top of the hillock to have the top portion of the undoped amorphous silicon film 5 partially exposed. The organic optical shielding film 9 is selectively provided to extends over the drain electrode 7. The organic optical shielding film 9 continuously extends within an aperture positioned over the undoped amorphous silicon layer 5 and between the source and drain electrodes 8 and 7. The organic optical shielding film 9 further continuously extends over the source electrode 8 except for its end portion in the vicinity of the metal optical shielding layer 11. The organic optical shielding film 9 covers the outer half portion of the metal optical shielding layer 11.

The above liquid crystal panel may be fabricated in processes to be described below. A transparent conductive film made of indium tin oxide is grown on an entire surface of the glass substrate 1. A chromium metal film is also formed on an entire surface of the transparent conductive film to form laminations of the transparent conductive film and the chromium metal film. The laminations are patterned to form the gate electrode 3, the scanning line 12 and the pixel electrode 2. The chromium metal film over the pixel electrode 2 is selectively removed to have the same on a peripheral portion of the pixel electrode 2 to thereby form the metal optical shielding film 11 on the peripheral portion of the pixel electrode 2. A gate insulation film 4 is deposited by a plasma chemical vapor deposition method over the glass substrate 1 to cover the gate electrode 3, the metal optical shielding film 11 and the pixel electrode 2. An undoped amorphous silicon film is deposited by the successive plasma chemical vapor deposition method on an entire surface of the gate insulation film. A highly doped amorphous silicon film is further deposited by the successive plasma chemical vapor deposition method on an entire surface of the undoped amorphous silicon film. The highly doped amorphous silicon film and the undoped amorphous silicon film are patterned by using the positive photo-resist film to form the undoped amorphous silicon film 5 and the highly doped amorphous silicon film 6. The undoped amorphous silicon layer 5 extends over the hillock and gradually sloped portions around the hillock. The highly doped amorphous silicon films 6 extends over the end portion of the top of the hillock as well as the gradually sloped portions of the hillock. The highly doped amorphous silicon films 6 are doped with phosphorus at a high impurity concentration so that amorphous silicon is in the degenerate state. The gate insulation film 4 is selectively removed to form an opening which extends over the pixel electrode 2 and the outer half portion of the metal optical shielding film 11. A chromium metal film is formed on an entire surface of the substrate to extend over the gate insulation film 4, the highly doped amorphous silicon film 6 as well as extends over the inner half portion of the metal optical shielding film 11 positioned in the vicinity of the thin film transistor region and over the pixel electrode 2. The chromium metal film is then patterned to form the drain electrode 7 and the source electrode 8 as well as the signal line 13. As a result, the highly doped amorphous silicon film 6 over the top of the hillock is positioned under an aperture between the drain electrode 7 and the source electrode 8. The highly doped amorphous silicon film 6 under the aperture between the drain electrode 7 and the source electrode 8 is selectively etched. The negative photo-resist film including the black pigment is applied on en entire surface of the substrate for exposure and subsequent development so that the organic optical shielding film 9 comprising the negative photo-resist film including the black pigment is formed. The organic optical shielding film 9 is selectively provided to extends over the drain electrode 7. The organic optical shielding film 9 continuously extends within an aperture positioned over the undoped amorphous silicon layer 5 and between the source and drain electrodes 8 and 7. The organic optical shielding film 9 further continuously extends over the source electrode 8 except for its end portion in the vicinity of the metal optical shielding layer 11. The organic optical shielding film 9 covers the outer half portion of the metal optical shielding layer 11. The organic optical shielding film 9 is provided over the thin film transistors, the scanning lines 12 and the signal lines 13 as well as over an outer half part of each of the metal optical shielding film 11, wherein the organic optical shielding film 9 has arrays of opening portions, each of which has edges positioned over a looped center line of the looped metal optical shielding film 11 so that each of the opening portions of the organic optical shielding film 9 extends over an inner half portion of the looped metal optical shielding film 11 and an exposed surface of the pixel electrode 2. Various organic or inorganic pigments or those mixtures are available for the black pigment to be contained in the photo-resist film constituting the organic optical shielding film 9.

As modifications, various non-photosensitive organic materials are available for the organic optical shielding film 9. In this case, an organic material distributed with polyaniline or a black pigment is applied and dried before the positive photoresist is applied for exposure and subsequent development to pattern the organic optical shielding film prior to removal of the used photo-resist.

The negative photo-resists CK-2000, CK-5002 CK-7000 commercially available from Fuji-Hunt Electronics Technology Co. may, for example, be available or the other negative photo-resists K-505, BK-412 commercially available from Tokyo Applied Chemical Industries Co. are also available. The non-photosensitive organic material BLACK-20 commercially available from Nikon Synthetic Rubber Co. is, for example, available.

The fabricated thin film transistor substrate is subjected to rubbing before the thin film transistor substrate is bonded through spacers to an opposite substrate to form a small gap between the thin film transistor substrate and the opposite substrate. A liquid crystal is injected into the small gap between the thin film transistor substrate and the opposite substrate to thereby fabricate the liquid crystal panel. No optical shielding film of black matrix is formed on the opposite substrate.

As illustrated in FIG. 3, the pixel electrode 2 and the signal line 13 are formed at the different levels and isolated from each other by the gate insulation film 4. For those reasons, it is possible to have the pixel electrode extends toward the signal line without contacting the pixel electrode 2 with the signal line. This results in increase in area of the pixel electrode 2. This further allows increase in area of the each opening portion. This results in an increased rate of the opening portions of the optical shielding film.

The opening portion of the pixel electrode 2 is defined by the inner edges of the metal optical shielding film 11 which extends inside rather than the organic optical shielding film 9. A deterioration of the orientation of the liquid crystal positioned in the vicinity of the edge portions of the organic optical shielding film 9 may be compensated by the metal optical shielding film 11 because the metal optical shielding film 11 covers the edges of the organic optical shielding film 9 so that a light having transmitted through the liquid crystal positioned in the vicinity of the edge of the organic optical shielding film 9. This means that the metal optical shielding film 11 suppresses any reduction in contrast of the display panel.

As described above, since the opening portion of the pixel electrode 2 is defined by the metal optical shielding film 11 having no variation of the opening pattern, the rate of opening area of the pixel electrode 2 is constant even the organic optical shielding film 9 has variations in opening patterns thereof. The constant rate of opening area of the pixel electrode 2 ensures a high quality and uniform high fine picture.

A second embodiment according to the present invention will be described with reference to FIGS. 2 and 4. A liquid crystal display panel of this embodiment is structurally different from that in the first embodiment in the light of further providing an inter-layer insulator over the drain and source electrode and under the organic optical shielding film 9.

Over a thin film transistor substrate, scanning lines 12 are provided to extend in parallel to each other and further signal lines 13 are provided to extend in parallel to each other but in vertical to the scanning lines 12 so as to matrixes, within each of which a pixel electrode 2 is provided. A thin film transistor is provided at one corner of each of the matrixes surrounded by the scanning lines 12 and the signal lines 13. The thin film transistor has a gate electrode 3 which is connected to the scanning line 12, a source electrode 8 which is connected to the pixel electrode 2 and a drain electrode 7 which is connected to the signal line 13 so that the pixel electrode 2 is electrically connected via the thin film transistor provided at the corner of the each matrix to the signal line 13 extends on a boundary between the matrixes. Metal optical shielding films 11 of a loop like shape is provided on a peripheral portion of each of the pixel electrode 2. An organic optical shielding film 9 is provided over the thin film transistors, the scanning lines 12 and the signal lines 13 as well as over an outer half part of each of the metal optical shielding film 11, wherein the organic optical shielding film 9 has arrays of opening portions, each of which has edges positioned over a looped center line of the looped metal optical shielding film 11 so that each of the opening portions of the organic optical shielding film 9 extends over an inner half portion of the looped metal optical shielding film 11 and an exposed surface of the pixel electrode 2.

Figure 4:
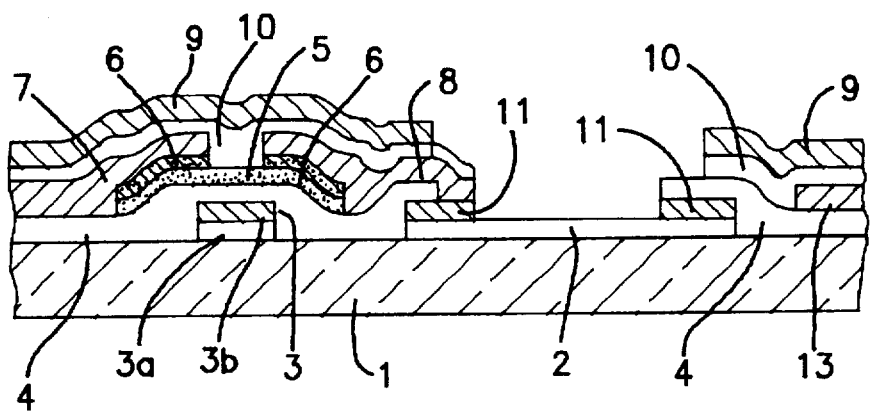
FIG. 4 is a fragmentary cross sectional elevation view illustrative of a novel liquid crystal panel having thin film transistors and pixel electrodes provided on a thin film transistor substrate in a second embodiment in accordance with the present invention.

FIG. 4 is a fragmentary cross sectional elevation view illustrative of a novel liquid crystal panel having thin film transistors and pixel electrodes provided on a thin film transistor substrate, taken along A–A' line in FIG. 2 in a second embodiment in accordance with the present invention.

On a single glass substrate 1, the thin film transistors and the pixel electrodes 2 are provided. Each of the pixel electrodes 2 is selectively provided on a predetermined area of the glass substrate 1, wherein the predetermined area is separated from an area on which each thin film transistor is formed. The metal optical shielding film 11 is provided on the peripheral region of the pixel electrode 2. A transparent conductive film 3a is selectively provided on the glass substrate 1, wherein the transparent conductive film 3a is spaced apart from the pixel electrodes 2. A metal film 3b is provided on the transparent conductive film 3a so that laminations of the transparent conductive film 3a and the metal film 3b forms the gate electrode 3. A gate insulation film 4 is provided which extends over the glass substrate 1 and the gate electrode 3 as well as over the outer half region of the metal optical shielding film 11 positioned adjacent to the thin film transistor but over the entire region of the metal optical shielding film 11 positioned adjacent to the signal line 13. The gate insulation film 4 does not extend over the inner half region of the metal optical shielding film 11 positioned adjacent to the thin film transistor and over the pixel electrode uncovered. The gate insulation film 4 has a hillock over the gate electrode and another hillock over the metal optical shielding film 11. An undoped amorphous silicon layer 5 is selectively provided on the gate insulation film 3 over the gate electrode 3 and its adjacent portion so that the undoped amorphous silicon layer 5 extends over the hillock and gradually sloped portions around the hillock. Highly doped amorphous silicon films 6 are separately formed on the undoped amorphous silicon layer 5 so that the highly doped amorphous silicon films 6 extend over the end portion of the top of the hillock as well as the gradually sloped portions of the hillock. The highly doped amorphous silicon films 6 are doped with phosphorus at a high impurity concentration so that amorphous silicon is in the degenerate state. The drain electrode is provided to extend over the highly doped amorphous silicon film 6 positioned at the left half side of the hillock and over the flat portion of the gate insulation film 4. The source electrode 8 is provided to extend over the highly doped amorphous silicon film 6 positioned at the right half side of the hillock and over the flat portion of the gate insulation film 4 and further continuously extends over the gate insulation film and the inner half portion of the metal optical shielding film 11. The drain and source electrodes 7 and 8 do not extend over the center area of the top of the hillock to have the top portion of the undoped amorphous silicon film 5 partially exposed. The inter-layer insulator 10 is selectively provided to extend over the drain electrode 7. The inter-layer insulator 10 continuously extends within an aperture positioned over the undoped amorphous silicon layer 5 and between the source and drain electrodes 8 and 7. The inter-layer insulator 10 further continuously extends over the source electrode 8. The inter-layer insulator 10 covers the entire portion of the metal optical shielding layer 11. The organic optical shielding layer 9 is formed on the inter-layer insulator 10. The organic optical shielding layer 9 covers the outer half portion of the metal optical shielding layer 11.

The above liquid crystal panel may be fabricated in processes to be described below. A transparent conductive film made of indium tin oxide is grown on an entire surface of the glass substrate 1. A chromium metal film is also formed on an entire surface of the transparent conductive film to form laminations of the transparent conductive film and the chromium metal film. The laminations are patterned to form the gate electrode 3, the scanning line 12 and the pixel electrode 2. The chromium metal film over the pixel electrode 2 is selectively removed to have the same on a peripheral portion of the pixel electrode 2 to thereby form the metal optical shielding film 11 on the peripheral portion of the pixel electrode 2. A gate insulation film 4 is deposited by a plasma chemical vapor deposition method over the glass substrate 1 to cover the gate electrode 3, the metal optical shielding film 11 and the pixel electrode 2. An undoped amorphous silicon film is deposited by the successive plasma chemical vapor deposition method on an entire surface of the gate insulation film. A highly doped amorphous silicon film is further deposited by the successive plasma chemical vapor deposition method on an entire surface of the undoped amorphous silicon film. The highly doped amorphous silicon film and the undoped amorphous silicon film are patterned by using the positive photo-resist film to form the undoped amorphous silicon film 5 and the highly doped amorphous silicon film 6. The undoped amorphous silicon layer 5 extends over the hillock and gradually sloped portions around the hillock. The highly doped amorphous silicon films 6 extends over the end portion of the top of the hillock as well as the gradually sloped portions of the hillock. The highly doped amorphous silicon films 6 are doped with phosphorus at a high impurity concentration so that amorphous silicon is in the degenerate state. The gate insulation film 4 is selectively removed to form an opening which extends over the pixel electrode 2 and the outer half portion of the metal optical shielding film 11. A chromium metal film is formed on an entire surface of the substrate to extend over the gate insulation film 4, the highly doped amorphous silicon film 6 as well as extends over the inner half portion of the metal optical shielding film 11 positioned in the vicinity of the thin film transistor region and over the pixel electrode 2. The chromium metal film is then patterned to form the drain electrode 7 and the source electrode 8 as well as the signal line 13. As a result, the highly doped amorphous silicon film 6 over the top of the hillock is positioned under an aperture between the drain electrode 7 and the source electrode 8. The highly doped amorphous silicon film 6 under the aperture between the drain electrode 7 and the source electrode 8 is selectively etched. An inter-layer insulator is formed to extend over the drain electrode 7. The inter-layer insulator 10 continuously extends within an aperture positioned over the undoped amorphous silicon layer 5 and between the source and drain electrodes 8 and 7. The inter-layer insulator 10 further continuously extends over the source electrode 8. The inter-layer insulator 10 covers the entire portion of the metal optical shielding layer 11. The chromium metal layer 8 and the inter-layer insulator 10 are selectively etched to expose the pixel electrode 2. The organic optical shielding layer 9 is formed on the inter-layer insulator 10. The organic optical shielding layer 9 covers the outer half portion of the metal optical shielding layer 11. The inter-layer insulator 10 allows that the organic optical shielding layer 9 is made of a low resistive material including carbon black pigment which possesses a high shielding ability than that as used in the first embodiment. For this reason, it may be possible to use a thin organic optical shielding film. This means that the step formed by the edge of the optical shielding layer 9 is small sufficiently for having the liquid crystal positioned in the vicinity of the edge of the organic optical shielding film free from any deterioration in orientation thereof.

The fabricated thin film transistor substrate is subjected to rubbing before the thin film transistor substrate is bonded through spacers to an opposite substrate to form a small gap between the thin film transistor substrate and the opposite substrate. A liquid crystal is injected into the small gap between the thin film transistor substrate and the opposite substrate to thereby fabricate the liquid crystal panel. No optical shielding film of black matrix is formed on the opposite substrate.

As illustrated in FIG. 4, the pixel electrode 2 and the signal line 13 are formed at the different levels and isolated from each other by the gate insulation film 4. For those reasons, it is possible to have the pixel electrode extends toward the signal line without contacting the pixel electrode 2 with the signal line. This results in increase in area of the pixel electrode 2. This further allows increase in area of the each opening portion. This results in an increased rate of the opening portions of the optical shielding film.

The opening portion of the pixel electrode 2 is defined by the inner edges of the metal optical shielding film 11 which extends inside rather than the organic optical shielding film 9. A deterioration of the orientation of the liquid crystal positioned in the vicinity of the edge portions of the organic optical shielding film 9 may be compensated by the metal optical shielding film 11 because the metal optical shielding film 11 covers the edges of the organic optical shielding film 9 so that a light having transmitted through the liquid crystal positioned in the vicinity of the edge of the organic optical shielding film 9. This means that the metal optical shielding film 11 suppresses any reduction in contrast of the display panel.

As described above, since the opening portion of the pixel electrode 2 is defined by the metal optical shielding film 11 having no variation of the opening pattern, the rate of opening area of the pixel electrode 2 is constant even the organic optical shielding film 9 has variations in opening patterns thereof. The constant rate of opening area of the pixel electrode 2 ensures a high quality and uniform high fine picture.

Whereas modifications of the present invention will be apparent o a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A thin film transistor substrate for a liquid crystal display panel, said thin film transistor substrate comprising:

a transparent insulative substrate;

a pixel electrode provided on a first predetermined region of said transparent insulative substrate;

a first optical shielding film being made of a metal and being provided on a peripheral region of said pixel electrode;

a thin film transistor provided on a second predetermined region of said transparent insulative substrate, said thin film transistor comprising a gate electrode provided on said transparent insulative substrate, a gate insulation film provided to extend over said second predetermined region to cover said gate electrode and also extend on at least an outer portion of said first optical shielding film, a source electrode extending at least over said gate insulation film over a first half of said gate electrode and being electrically connected to said pixel electrode, and a drain electrode extending at least over said gate insulation film over a second half of said gate electrode;

a signal line extending over said gate insulation film to said drain electrode so that said signal line is positioned above said pixel electrode and separated by said gate oxide film from said pixel electrode; and a second optical shielding film extending over said thin film transistor provided on said second region and also extending over an outer part of said first optical shielding film so that an opening portion of said pixel electrode is substantially defined by an inside edge of said first optical shielding film.

2. The thin film transistor substrate as claimed in claim 1, wherein said transparent insulative substrate is a glass substrate.

3. The thin film transistor substrate as claimed in claim 1, wherein said second optical shielding film is made of a resistive organic material.

4. The thin film transistor substrate as claimed in claim 1, further comprising an inter-layer insulator extending under said second optical shielding film and over said source and drain electrodes to isolate said second optical shielding film from said source and drain electrodes.

5. The thin film transistor substrate as claimed in claim 4, wherein said second optical shielding film is made of a conductive organic material.

6. The thin film transistor substrate as claimed in claim 1, wherein said source electrode further extends over said inner portion of said first optical shielding film and over a part of said pixel electrode in the vicinity of said first optical shielding film.

7. The thin film transistor substrate as claimed in claim 1, wherein said source electrode further extends over said inner portion of said first optical shielding film.

8. The thin film transistor substrate as claimed in claim 1, wherein said first optical shielding film is made of chromium.

9. The thin film transistor substrate as claimed in claim 1, wherein said second optical shielding film is made of a photo-sensitive organic material.

10. The thin film transistor substrate as claimed in claim 1, wherein said second optical shielding film is made of a non photo-sensitive organic material.

11. A thin film transistor substrate for a liquid crystal display panel, said thin film transistor substrate comprising:

a transparent insulative substrate;

a plurality of scanning lines extending over said transparent insulative substrate in a first direction;

a plurality of signal lines extending over said transparent insulative substrate in a second direction vertical to said first direction so that signal lines in cooperation with said scanning lines form arrays of pixel regions surrounded by said scanning lines and said signal lines;

wherein each of said pixel regions has:
- a pixel electrode provided on a first predetermined region of said transparent insulative substrate;
- a first optical shielding film being made of a metal and being provided on a peripheral region of said pixel electrode;
- a thin film transistor provided on a second predetermined region of said transparent insulative substrate, said thin film transistor comprising a gate electrode provided on said transparent insulative substrate, a gate insulation film provided to extend over said second predetermined region to cover said gate electrode and also extend on at least an outer portion of said first optical shielding film, a source electrode extending at least over said gate insulation film over a first half of said gate electrode and being electrically connected to said pixel electrode, and a drain electrode extending at least over said gate insulation film over a second half of said gate electrode;
- said signal line extending over said gate insulation film to said drain electrode so that said signal line is positioned above said pixel electrode and separated by said gate oxide film from said pixel electrode; and
- a second optical shielding film extending over said thin film transistor provided on said second region and also extending over an outer part of said first optical shielding film so that an opening portion of said pixel electrode is substantially defined by an inside edge of said first optical shielding film.

12. The thin film transistor substrate as claimed in claim 11, wherein said transparent insulative substrate is a glass substrate.

13. The thin film transistor substrate as claimed in claim 11, wherein said second optical shielding film is made of a resistive organic material.

14. The thin film transistor substrate as claimed in claim 11, further comprising an inter-layer insulator extending under said second optical shielding film and over said source and drain electrodes to isolate said second optical shielding film from said source and drain electrodes.

15. The thin film transistor substrate as claimed in claim 14, wherein said second optical shielding film is made of a conductive organic material.

16. The thin film transistor substrate as claimed in claim 11, wherein said source electrode further extends over said inner portion of said first optical shielding film and over a part of said pixel electrode in the vicinity of said first optical shielding film.

17. The thin film transistor substrate as claimed in claim 11, wherein said source electrode further extends over said inner portion of said first optical shielding film.

18. The thin film transistor substrate as claimed in claim 11, wherein said first optical shielding film is made of chromium.

19. The thin film transistor substrate as claimed in claim 11, wherein said second optical shielding film is made of a photo-sensitive organic material.

20. The thin film transistor substrate as claimed in claim 11, wherein said second optical shielding film is made of a non photo-sensitive organic material.

* * * * *